United States Patent [19] [11] 4,149,923
Uehara et al. [45] Apr. 17, 1979

[54] APPARATUS FOR THE TREATMENT OF WAFER MATERIALS BY PLASMA REACTION

[75] Inventors: Akira Uehara, Yokohama; Hisashi Nakane, Kawasaki, both of Japan

[73] Assignee: Tokyo Ohka Kogyo Kabushiki Kaisha, Kawasaki, Japan

[21] Appl. No.: 916,251

[22] Filed: Jun. 16, 1978

[30] Foreign Application Priority Data

Jul. 18, 1977 [JP] Japan .................................. 52/85880

[51] Int. Cl.$^2$ ....................... H01L 21/306; C23F 1/00
[52] U.S. Cl. .................... 156/345; 156/643; 156/646; 204/298; 250/531
[58] Field of Search ............ 204/192 EC, 192 E, 298, 204/164; 250/531, 542; 156/643, 646, 345

[56] References Cited

U.S. PATENT DOCUMENTS 3,875,068  4/1975  Mitzel ............................... 250/542 X
4,094,722  6/1978  Yamamoto ........................... 156/345

Primary Examiner—William A. Powell
Attorney, Agent, or Firm—Brisebois & Kruger

[57] ABSTRACT

An automatic apparatus for the treatment of wafer materials by plasma reaction is proposed in which the wafers are sent into the plasma reaction chamber one by one and yet the atmospheric air is never introduced into the reaction chamber between the successive reaction steps for two wafers by use of two rotary vacuum valves which also serve as wafer transmitters into and out of the reaction chamber and a rotary wafer table inside the reaction chamber, all being installed on an inclined base table to effect the downward spontaneous movement of the wafer under treatment by gravity.

6 Claims, 2 Drawing Figures

APPARATUS FOR THE TREATMENT OF WAFER MATERIALS BY PLASMA REACTION

BACKGROUND OF THE INVENTION

The present invention relates to a novel precision apparatus for the treatment of a wafer material by low-temperature gas plasma reaction provided with an automatic handling mechanism of the wafer.

Recent development in electronics industry is very remarkable and the processing technology of electronic parts such as in transistors, ICs, LSIs, super-LSIs and the like is also rapidly growing. In the photo-fabrication of semiconductor substrate as a typical one of such processing technologies, for example, it is a general trend in etching treatment that a dry-etching process by use of a gas plasma is becoming more and more prevalent replacing the conventional wet-etching process by use of an etching solution. Even when a wet-etching process is undertaken for the precision fabrication of a wafer material, a pretreatment by plasma reaction is recommended for improving the wettability of the surface.

All of the prior art apparatuses for such a gas plasma treatment of wafers are designed for batch-wise operation. For example, 10 to 25 wafers in vertical positions mounted on a wafer stand are placed in a plasma reaction tube, the reaction tube is evacuated and filled with the plasma gas, plasma is generated by applying an electric voltage to effect desired etching and the wafers are taken out of the reaction tube as held on the wafer stand.

One of the major problems in the batch-wise apparatus of the prior art as above is the unevenness of the plasma reaction. Namely, etching with the plasma gas can never be very even on all of so many numbers of the wafers positioned over a considerable length in the reaction tube bringing about 10% or more of unevenness in the etching by the plasma reaction. Inspite of the efforts to mitigate such an unevenness by the improvement in the shapes of the reaction tubes and the conditions of the reaction, no satisfactory results have been hitherto obtained.

In the batch-wise apparatuses of the prior art in general, on the other hand, the wafers to be treated are sent from the preceding treatment process as mounted on a wafer cassette, from where they are picked up one by one manually with tweezers and mounted on a wafer stand to be placed in the reaction tube. After completion of the plasma treatment, the wafers are again handled manually to be mounted on another wafer cassette to be sent to the succeeding process. It is a large problem in this manner of manual handling in the plasma treatment process that the full automatization in series of the whole wafer processing procedure is heavily interrupted by this plasma treatment step whereas the wafer cassette can be run through all of the other process steps such as coating of the photoresist, exposure to light, development and rinsing. What is still worse, the wafers thus handled manually with tweezers are sometimes marred by scratching or even cracked. A difficulty should also be taken into consideration that tweezers are not suitable for the handling of large-sized wafers as in the recent trend of semiconductor technology in which larger and larger wafers are coming into current.

Recently, several types of automatic apparatuses are proposed for the plasma treatment of wafer materials. In these automatic apparatuses, the wafers are sent into the plasma reaction chamber one by one automatically and the chamber having received a wafer, is closed, evacuated and filled with plasma gas and, after completion of the plasma treatment, atmospheric air is introduced into the chamber and the chamber is opened to take out the plasma-treated wafer. In such a construction of the apparatus, evacuation of the reaction chamber and introduction of atmospheric air into the chamber must be undertaken alternately for each of the wafers under plasma treatment thus greatly reducing the productivity of the overall processes.

SUMMARY OF THE INVENTION

It is therefore an object of the present invention to provide a novel and improved apparatus for the treatment of wafer materials by plasma reaction with which the wafer materials, e.g. wafers of high-purity silicon semiconductors, can be subjected one by one to the plasma treatment and yet the atmospheric air is never introduced into the plasma reaction chamber between the successive treatment processes of two wafers so as that the loss in time by the evacuation of the plasma reaction chamber is minimized to give very high productivity.

Thus the apparatus for the treatment of wafer materials by plasma reaction as disclosed by the present invention comprises the components of (a) an inclined base, (b) a plasma reaction chamber positioned at a middle height of the inclined base, (c) a wafer table revolvable inside the plasma reaction chamber within a plane substantially parallel to the surface of the inclined base, (d) a first preparatory chamber of cylindrical form with an axis substantially perpendicular to the surface of the inclined base positioned at the upward position to the plasma reaction chamber on the inclined base, (e) a first cylindrical block revolvable inside the first preparatory chamber in vacuum-tight sliding with the inner walls of the first preparatory chamber and provided with a pocket having an opening with a width sufficient to reveive the wafer, (f) a first duct connecting the first preparatory chamber and the plasma reaction chamber, (g) a second preparatory chamber of cylindrical form with an axis substantially perpendicular to the surface of the inclined base positioned at the downward position to the plasma reaction chamber on the inclined base, (h) a second cylindrical block revolvable inside the second preparatory chamber in vacuum-tight sliding with the inner walls of the second preparatory chamber and provided with a pocket having an opening with a width sufficient to receive the wafer, (i) a second duct connecting the plasma reaction chamber and the second preparatory chamber, (j) a means for supplying the wafer to the first preparatory chamber, (k) a means for receiving the wafer from the second preparatory chamber, and (l) a control means for bringing the rotation of the components (c), (e) and (h) in linkage motion.

DETAILED DESCRIPTION OF THE PREFERRED EMBODIMENTS

Figure 1:
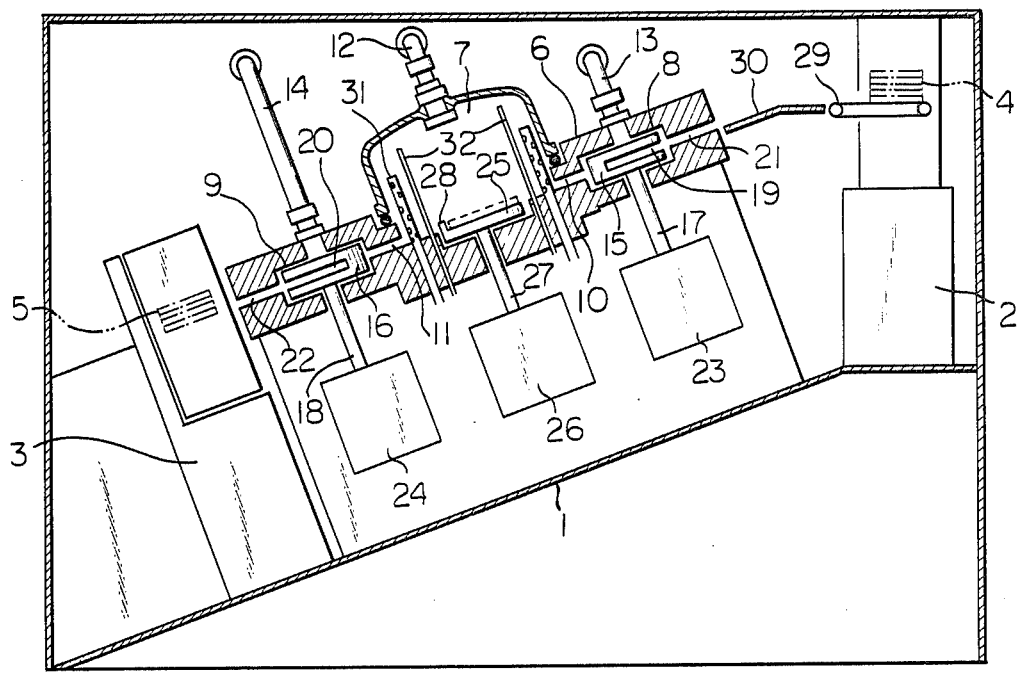
FIG. 1 is a cross sectional side view of the inventive apparatus.

A preferred embodiment of the inventive apparatus is described in detail with reference to the drawing attached.

In FIG. 1, 1 is an inclined base table on which the apparatus is mounted. A cassette elevator 2 is provided at the upper end of the inclined base table 1 which serves for lowering the wafer cassette 4 holding the wafers before the plasma treatment in a stepwise manner. Likewise, another cassette elevator 3 is provided at the lower end of the inclined base table 1 which serves for elevating the wafer cassette 5 mounting the wafers after the plasma reaction treatment in a stepwise manner.

Between these two cassette elevators 2 and 3 is bridgedly supported an inclined base 6 having a dome-like plasma reaction chamber 7 at the middle height and a first and a second preparatory chambers 8 and 9 at the upper and lower positions, respectively, of the plasma reaction chamber 7. These preparatory chambers 8 and 9 are each of a flat cylindrical form with the axis in the up and down direction, i.e. in the direction substantially perpendicular to the inclined base 6. The first preparatory chamber 8 is connected to the plasma reaction chamber 7 by a first duct 10 having a cross section sufficient to permit a wafer to slide down through it. Similarly the second preparatory chamber 9 is connected to the plasma reaction chamber 7 by a similar second duct 11. The first duct 10 and the second duct 11 connect the first preparatory chamber 8, the plasma reaction chamber 7 and the second preparatory chamber 9 in alignment, preferably, in a straight line and must have a vacuum-tight structure. The plasma reaction chamber 7, the first preparatory chamber 8 and the second preparatory chamber 9 are each connected to a vacuum pump (not shown) by the vacuum lines 12, 13 and 14, respectively, so as to be evacuated to a desired degree of vacuum.

The angle of inclination of the base 6 is determined so as that a smooth sliding down of the wafer materials is ensured although it should be taken into consideration that too large angles of inclination lead to too rapid sliding down of the wafers with some danger of cracking or breaking of the wafers especially when the diameter of the wafers to be treated is large. Usually the angle is preferably between 20° and 30° with preference of relatively smaller angles in this range in an apparatus for large-sized wafer materials.

Figure 2:
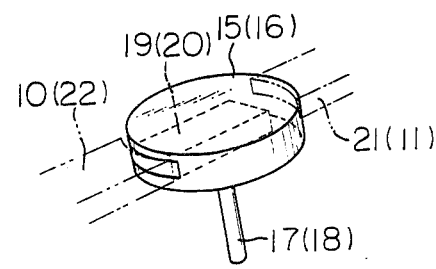
FIG. 2 is a perspective view of a revolvable cylindrical block as the component (e) or (h) with adjacent ducts shown with the chained lines.

Inside the first preparatory chamber 8 is built in a first flat cylindrical block 15 just fitting to the inside walls of the first preparatory chamber 8 so that the vacuum-tight sliding rotation of the block 15 inside the chamber 8 is ensured. The first block 15 is revolved with the shaft 17 penetrating the underside wall of the inclined base 6 with vacuum-tight sealing and connected to the driving unit 23. As is shown in FIG. 2 which is a perspective view of the cylindrical block 15, the block 15 has a pocket 19 sufficiently broad to keep a wafer inside and having a mouth or opening sufficiently wide to permit a wafer to pass into the pocket 19. It is desirable that, when the block is rotated to the position where the mouth of the pocket 19 is just in conjunction with the upper end of duct 10, the wafer held in the pocket 19 can smoothly slide down to the duct 10.

The disposition of the second preparatory chamber 9 is just the same as in the first preparatory chamber 8 with a second cylindrical block 16, a shaft 18 connected to another driving unit 24 and the connection to the duct 11 for receiving a wafer from the plasma reaction chamber 7 into the pocket 20.

The first preparatory chamber 8 has another duct 21 at the position opposite to the duct 10 for the transfer of a wafer from the wafer cassette 4 to the pocket 19 in the first preparatory chamber 8. Similarly the second preparatory chamber 9 has another duct 22 at the position opposite to the duct 11 for discharging a wafer in the pocket 20 to the wafer cassette 5. Thus the first and the second cylindrical blocks 15 and 16 serve simultaneously as the wafer transmitters for transmitting a wafer from the wafer cassette 4 to the plasma reaction chamber 7 or from the plasma reaction chamber 7 to the wafer cassette 5 and as the rotary vacuum valves.

A wafer table 25 provided inside the plasma reaction chamber 7 is revolvable in a plane substantially parallel to the inclined base 6 by being driven with a driving unit 26 through a shaft 27 penetrating the underside wall of the plasma reaction chamber 7 with a vacuum-tight sealing. The wafer table 25 has a stopper 28 protruding on the surface at an eccentric position apart from the center which serves to prevent the wafer on the wafer table 25 from sliding down when it is at the lowermost position by the rotation of the wafer table 25 but not to disturb the sliding of the wafer when it is at the uppermost position by the 180° rotation of the wafer table 25.

A feeder belt 29 connects the wafer cassette 4 and the opening of the duct 21 to facilitate the feeding of a wafer into the duct 21 via a wafer slide 30.

The functional movement of the inventive apparatus constructed as described above is now explained below.

A wafer to be treated by the plasma reaction is taken out of the wafer cassette 4 being lowered stepwise by a height equal to the thickness of a wafer by the downward movement of the cassette elevator 2 and conveyed by the feeder belt 29 on to the wafer slide 30, on which the wafer slides down toward the upper end of the duct 21 through which it reaches the first preparatory chamber 8 where the wafer is received into the pocket 19 of the first cylindrical block 15 having its mouth in direct conjunction with the lower end of the duct 21 thus permitting the smooth receipt of the wafer into the pocket 19. Then the cylindrical block 15 is rotated by 90° by actuating the driving unit 23 whereby the pocket 19 is disconnected from the open air and connected to the vacuum line 13 so as to be evacuated to a desired degree of vacuum.

When the vacuum inside the first preparatory chamber 8 has reached about the same degree as in the plasma reaction chamber 7, the cylindrical block 15 is rotated by further 90° so as that the mouth of the pocket 19 is brought into direct conjunction with the upper end of the duct 10 whereby the wafer held in the pocket 19 can smoothly slide down through the duct 10 on to the wafer table 25 where the wafer is stopped by the stopper 28 positioned at the lower position of the revolvable wafer table 25 whereupon the first cylindrical block 15 is further rotated by 180° so as that the first preparatory chamber 8 is disconnected from the plasma reaction chamber 7 and the pocket 19 is ready for receiving the next wafer.

When the wafer has settled on the wafer table 25, the plasma gas is introduced into the chamber 7 through the gas nozzles 31 from the gas source (not shown) followed by the application of a high voltage between the electrodes 32 and the inclined base 6 which serves as the grounded counterelectrode by operating a high-frequency generator (not shown) to produce plasma inside the chamber 7 to effect the plasma treatment of the wafer mounted on the wafer table 25. It is of course that, during the period when the plasma treatment is going on action, the mouth of the pocket 20 of the second cylindrical block 16 in the second preparatory chamber 9 is in the direction perpendicular to the direction of the ducts 11 and 22 so as that the second preparatory chamber 9 is connected to the line 14 to be evacuated to a high vacuum with disconnection from the plasma reaction chamber 7.

On completion of the plasma treatment in the plasma reaction chamber 7, the second cylindrical block 16 is rotated by 90° so as that the mouth of the pocket 20 is brought into direct conjunction with the lower end of the duct 11 to be ready to receive the wafer and the wafer table 25 is rotated by 180° whereby the wafer on the wafer table 25 leaves the wafer stopper 28 and slides down into the pocket 20 through the duct 11.

The second cylindrical block 16 is then rotated further by 90° so as that the connection of the second preparatory chamber 9 and the plasma reaction chamber 7 through the duct 11 becomes off followed by the introduction of air into the second preparatory chamber 16 from the open air to bring the pressure inside the second preparatory chamber 16 to atmospheric. Thereafter the second cylindrical block 16 is rotated by further 90° to bring the mouth of the pocket 20 into direct conjunction with the upper end of the duct 22 so that the wafer held in the pocket 20 can slide down in the duct 22 toward the wafer cassette 5 mounted on the cassette elevator 3.

As is understood from the above description, movements of the driving units 23, 24 and 26 are so programmed that the first and the second cylindrical blocks 15 and 16 as well as the wafer table 25 are rotated in linkage motion intermittently by 90° or 180° along with the stepwise lowering or elevation of the cassette elevators 2 and 3. These linkage motions are controlled by well known programming control mechanisms as used, for example, in an automatic machining with machine tools. The control mechanism may be either mechanical having a plurality of cams fixed to a rotating shaft with which the individual parts are brought into motion in predetermined sequential order for desired lengths of time or electrical with a plurality of electric relays connected in sequence.

The inventive apparatus for automatic plasma treatment of wafer materials is particularly advantageous in that the plasma reaction chamber 7 has no chance to be connected to the open air so that the pressure inside the chamber can be kept constantly at a high level of vacuum and the stability of the plasma gas is obtained leading to very even results in the plasma treatment of wafers as a result of providing the first and the second preparatory chambers 8 and 9 with the cylindrical blocks 15 and 16 which serve simultaneously as the rotary vacuum valves and the wafer transmitters. The inventive apparatus is also advantageous with its compactness owing to the smallness of the moving parts of the cylindrical blocks 15 and 16 and the like thus giving a possibility of an efficient design of an automatized lines in a semiconductor plant in which several of the inventive apparatuses can be installed in a small area.

What is claimed is:

1. An apparatus for the treatment of a wafer material by plasma reaction which comprises the components of
   (a) an inclined base,
   (b) a plasma reaction chamber positioned at a middle height of the inclined base,
   (c) a wafer table revolvable inside the plasma reaction chamber within a plane substantially parallel to the surface of the inclined base,
   (d) a first preparatory chamber of cylindrical form with an axis substantially perpendicular to the surface of the inclined base positioned at the upward position to the plasma reaction chamber on the inclined base,
   (e) a first cylindrical block revolvable inside the first preparatory chamber in vacuum-tight sliding with the inner walls of the first preparatory chamber and provided with a pocket having an opening with a width sufficient to receive the wafer,
   (f) a first duct connecting the first preparatory chamber and the plasma reaction chamber,
   (g) a second preparatory chamber of cylindrical form with an axis substantially perpendicular to the surface of the inclined base positioned at the downward position to the plasma reaction chamber on the inclined base,
   (h) a second cylindrical block revolvable inside the second preparatory chamber in vacuum-tight sliding with the inner walls of the second preparatory chamber and provided with a pocket having an opening with a width sufficient to receive the wafer,
   (i) a second duct connecting the plasma reaction chamber and the second preparatory chamber,
   (j) a means for supplying the wafer to the first preparatory chamber,
   (k) a means for receiving the wafer from the second preparatory chamber, and
   (l) a control means for bringing the rotation of the components (c), (e) and (h) in linkage motion.

2. The apparatus as claimed in claim 1 wherein the components (b), (d) and (g) are connected by the components (f) and (i) in alignment in a straight line.

3. The apparatus as claimed in claim 1 wherein the component (j) is a wafer cassette mounted on a cassette elevator capable of lowering stepwise by a height equal to the thickness of a wafer.

4. The apparatus as claimed in claim 1 wherein the component (k) is a wafer cassette mounted on a cassette elevator capable of elevating stepwise by a height equal to the thickness of a wafer.

5. The apparatus as claimed in claim 1 wherein each of the components (b), (d) and (g) is connected to a vacuum line.

6. The apparatus as claimed in claim 1 wherein the angle of inclination of the inclined base is in the range from 20° to 30°.

* * * * *